US011811370B2

(12) United States Patent
Zanbaghi et al.

(10) Patent No.: US 11,811,370 B2
(45) Date of Patent: Nov. 7, 2023

(54) COMMON-MODE COMPENSATION IN A MULTI-LEVEL PULSE-WIDTH MODULATION SYSTEM

(71) Applicant: Cirrus Logic International Semiconductor Ltd., Edinburgh (GB)

(72) Inventors: Ramin Zanbaghi, Austin, TX (US); Lingli Zhang, Austin, TX (US); Wei Xu, Austin, TX (US); Justin Richardson, Edinburgh (GB); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/502,689

(22) Filed: Oct. 15, 2021

(65) Prior Publication Data

US 2023/0122394 A1 Apr. 20, 2023

(51) Int. Cl.
*H03F 3/217* (2006.01)
*G01R 19/25* (2006.01)

(52) U.S. Cl.
CPC ......... *H03F 3/217* (2013.01); *G01R 19/2506* (2013.01); *H03F 2200/375* (2013.01)

(58) Field of Classification Search
CPC ............... H03F 3/217; H03F 2200/375; H03F 2200/03; H03F 2200/345; H03F 2200/351; H03F 2200/462; H03F 2200/481; H03F 2203/45112; H03F 2203/45116; H03F 2203/45136; H03F 2203/45526; H03F 2203/45594; H03F 3/213; H03F 3/2173; H03F 3/45475; H03F 3/45632; H03F 3/45645; H03F 3/187; G01R 19/2506

USPC .................................................. 330/251, 258
See application file for complete search history.

(56) References Cited

U.S. PATENT DOCUMENTS

2017/0141732 A1\* 5/2017 Parupalli ............. H03F 3/45937
2017/0373655 A1 12/2017 Mengad et al.

OTHER PUBLICATIONS

Maxim Integrated, MAX98395—Digital Input Class DG Amplifier with I/V Sense and Ultra-Low Quiescent Power, Oct. 2019, Accessed at https://datasheets.maximintegrated.com/en/ds/MAX98395.pdf (Year: 2019).\*
International Search Report and Written Opinion of the International Searching Authority, International Application No. PCT/US2022/045627, dated Feb. 13, 2023.
Definition of "common-mode". The New IEEE Standard Dictionary of Electrical and Electronics Terms, 5th Ed., p. 217 (1993).

\* cited by examiner

*Primary Examiner* — Andrea Lindgren Baltzell
*Assistant Examiner* — Khiem D Nguyen
(74) *Attorney, Agent, or Firm* — Jackson Walker L.L.P

(57) ABSTRACT

A system for sensing an electrical quantity may include a sensing stage configured to sense the electrical quantity and generate a sense signal indicative of the electrical quantity, wherein the electrical quantity is indicative of an electrical signal generated by a Class-DG amplifier configured to drive a load wherein the Class-DG amplifier has multiple signal-level common modes and a common-mode compensator configured to compensate for changes to a common-mode voltage of a differential supply voltage of the driver occurring when switching between signal-level common modes of the Class-DG amplifier.

22 Claims, 8 Drawing Sheets

COMMON-MODE COMPENSATION IN A MULTI-LEVEL PULSE-WIDTH MODULATION SYSTEM

FIELD OF DISCLOSURE

The present disclosure relates in general to circuits for audio devices, including without limitation personal audio devices, such as wireless telephones and media players, and more specifically, to systems and methods for common-mode compensation in a multi-level pulse-width modulation system.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation (PDM), or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier and/or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Some amplifier architectures provide for at least two supply voltages for powering a power amplifier, in order to achieve greater power efficiency over single or constant power supply voltage architectures. One example of a multi-supply voltage amplifier is a Class-G amplifier. A Class-G amplifier may provide two or more power supplies at different voltages and switch between them as the signal output approaches each level. Thus, a Class-G amplifier may increase efficiency by reducing the wasted power at output driving transistors of the amplifier. In some instances, a Class-G amplifier may be combined with a Class-D amplifier to create a Class-DG amplifier. A Class-DG amplifier may use pulse-width modulation to produce a rail-to-rail digital output signal with a variable duty cycle as a pre-driver signal to an output driver, as is typical with Class-D amplifiers. However, as opposed to a Class-D amplifier, a Class-DG amplifier may use a multi-level output stage which senses a magnitude of the audio output signal and switches between power supplies based on the output magnitude.

In some instances, a Class-DG amplifier may be supplied from both a positive power rail and a negative power rail, and each power rail may have a variable supply voltage selected from two or more power supplies. For example, each of the positive power rail and negative power rail may be variable among −5V, 0V, 5V, and 10 V, such that a fully-differential output of the Class-DG amplifier may vary among −15V, −10V, −5V, 0V, 5V, 10V, and 15V.

One disadvantage of such a Class-DG architecture is that as the Class-DG amplifier selects among the different power rail supply voltages, a step may occur in the common-mode voltage of the positive power rail and the negative power rail. If an output current or output voltage is delivered to a load of the Class-DG amplifier, the changing common-mode voltage may be replicated to the current- or voltage-sensing circuitry, thus leading to inaccuracies in sensor measurements.

SUMMARY

In accordance with the teachings of the present disclosure, one or more disadvantages and problems associated with existing approaches to measuring output signals driven by an output stage may be reduced or eliminated.

In accordance with embodiments of the present disclosure, a system for sensing an electrical quantity may include a sensing stage configured to sense the electrical quantity and generate a sense signal indicative of the electrical quantity, wherein the electrical quantity is indicative of an electrical signal generated by a Class-DG amplifier configured to drive a load wherein the Class-DG amplifier has multiple signal-level common modes and a common-mode compensator configured to compensate for changes to a common-mode voltage of a differential supply voltage of the driver occurring when switching between signal-level common modes of the Class-DG amplifier.

In accordance with these and other embodiments of the present disclosure, a method for sensing an electrical quantity may include generating a sense signal indicative of the electrical quantity, wherein the electrical quantity is indicative of an electrical signal generated by a Class-DG amplifier configured to drive a load wherein the Class-DG amplifier has multiple signal-level common modes and compensating for changes to a common-mode voltage of a differential supply voltage of the driver occurring when switching between signal-level common modes of the Class-DG amplifier.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
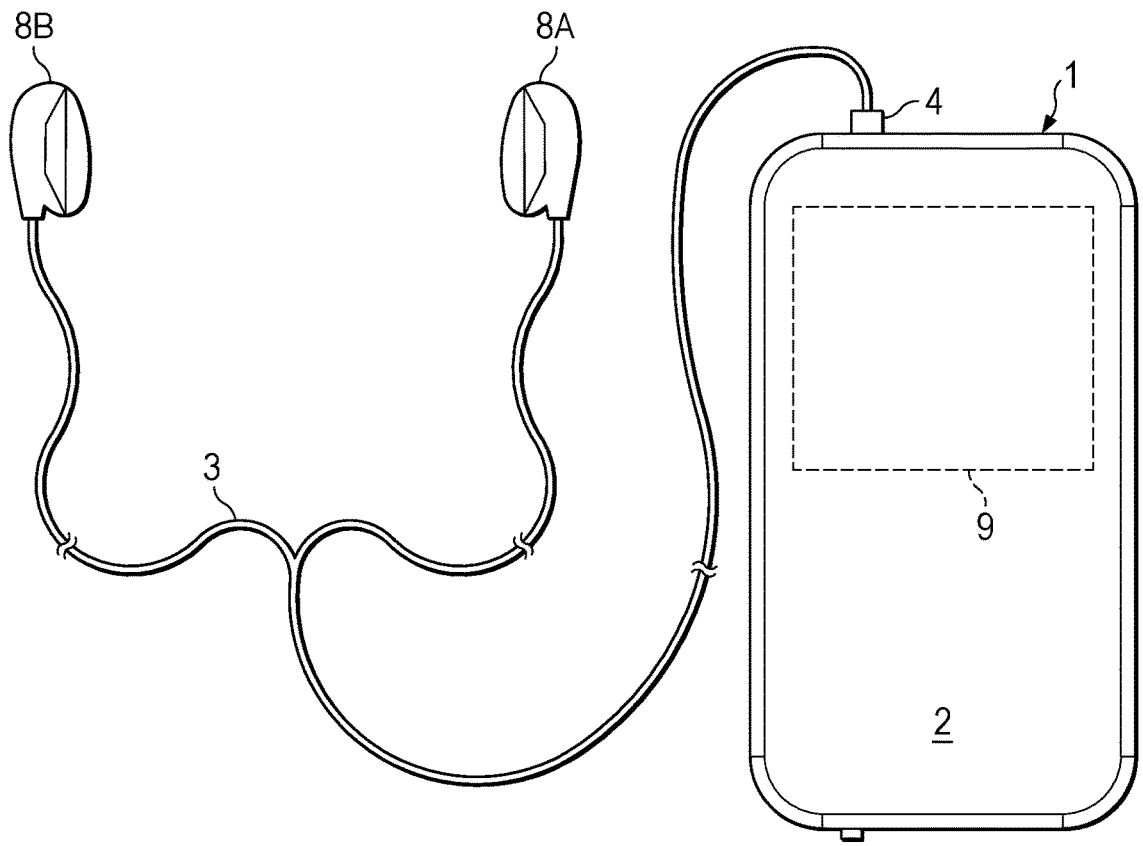
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
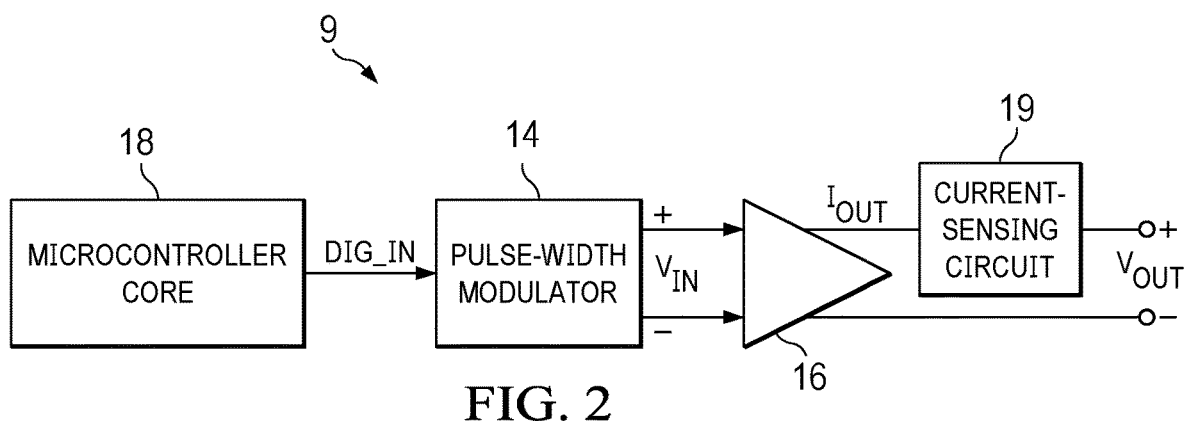
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a pulse-width modulator 14, which may convert the digital audio input signal to an equivalent differential pulse-width modulated input signal $V_{IN}$, whereby a pulse width or duty cycle of input signal $V_{IN}$ may be indicative of the value (e.g., magnitude and polarity) of digital audio input signal DIG_IN. Pulse-width modulator 14 may supply analog input signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output. As also shown in FIG. 2, example audio IC 9 may include a current sensing circuit 19 configured to sense an output current $I_{OUT}$ generated by amplifier 16 and delivered to a load coupled to the output of amplifier 16, as described in greater detail below.

Figure 3:
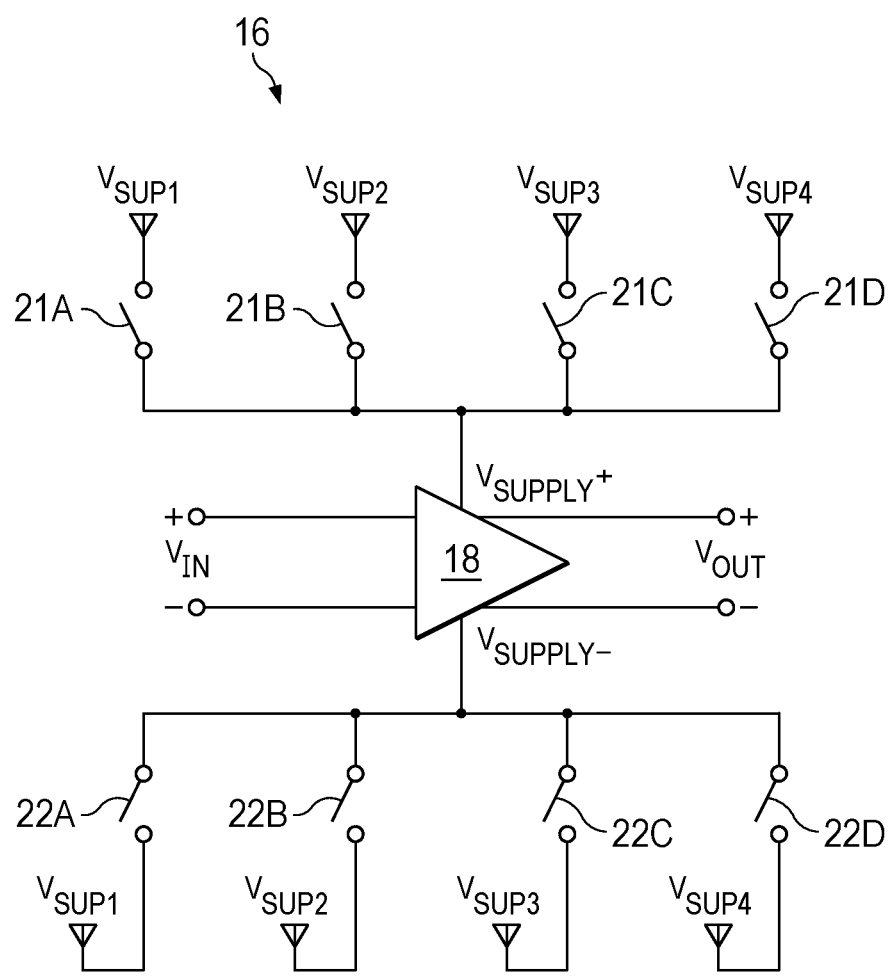
FIG. 3 illustrates a block diagram of selected components of an example amplifier, in accordance with embodiments of the present disclosure.

FIG. 3 illustrates a block diagram of selected components of an example amplifier 16, in accordance with embodiments of the present disclosure. In some embodiments, amplifier 16 may be used to implement all or a portion of amplifier 16 of FIG. 1. As shown in FIG. 3, amplifier 16 of FIG. 2 may be implemented with a Class DG amplifier 18 which has an input for receiving analog signal $V_{IN}$, an output for generating an output signal $V_{OUT}$ based on and indicative of analog signal $V_{IN}$, and a power supply input for receiving one of a plurality of power supply voltages (e.g., $V_{SUP1}$, $V_{SUP2}$, $V_{SUP3}$, $V_{SUP4}$) at each of its positive supply terminal and negative supply terminal based on one or more control signals for selectively activating (e.g., enabling, closing, turning on) and deactivating (e.g., disabling, opening, turning off) switches 21 (e.g., switches 21A, 21B, 21C, and 21D) and 22 (e.g., switches 22A, 22B, 22C, and 22D), wherein each of switches 21 couples the positive supply terminal having positive supply terminal voltage $V_{SUPPLY}^+$ to a respective supply voltage (e.g., $V_{SUP1}$, $V_{SUP2}$, $V_{SUP3}$, $V_{SUP4}$) and each of switches 22 couples the negative supply terminal having negative supply terminal voltage $V_{SUPPLY}^-$ to a respective supply voltage (e.g., $V_{SUP1}$, $V_{SUP2}$, $V_{SUP3}$, $V_{SUP4}$). For purposes of clarity and exposition, FIG. 3 depicts amplifier 16 as having four selectable power supply voltages. However, amplifier 16 may have any suitable number of selectable power supply voltages.

To further illustrate operation of amplifier 16, in some embodiments, supply voltages may be configured such that $V_{SUP1}=-5V$, $V_{SUP2}=0V$, $V_{SUP3}=5V$, and $V_{SUP4}=10V$, and switches 21 and 22 may be controlled such that a full-swing differential supply voltage $V_{SUPPLY}=V_{SUPPLY}^+-V_{SUPPLY}^-$ may vary among $-15V$, $-10V$, $-5V$, 0V, 5V, 10V, and 15V. FIGS. 4A-4E illustrate example graphs of selected waveforms associated with amplifier 16, in accordance with embodiments of the present disclosure, and which use the example supply voltages enumerated in the previous sentence.

Figure 4A:
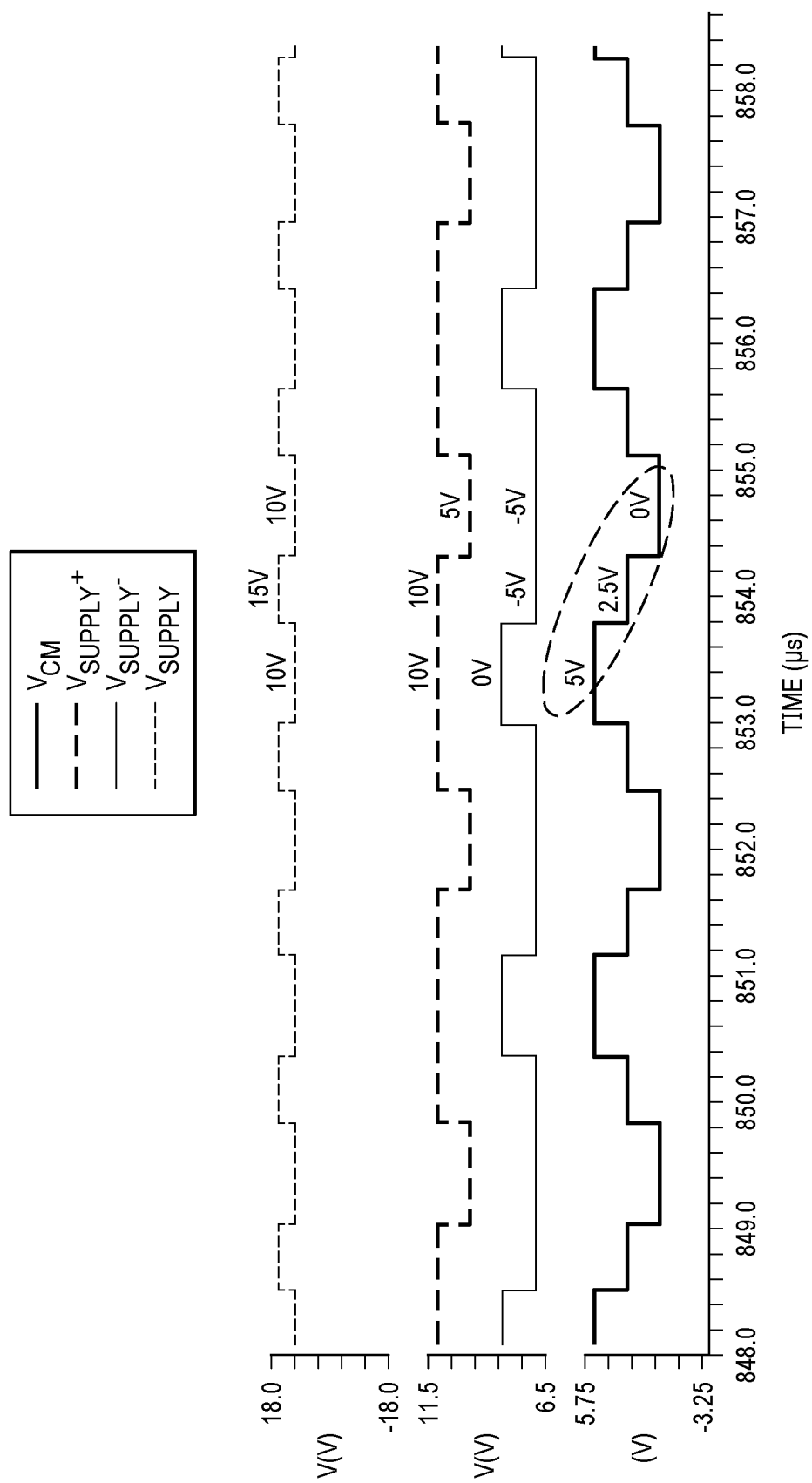
FIGS. 4A, 4B, 4C, 4D, and 4E illustrate example graphs of selected waveforms associated with an amplifier, in accordance with embodiments of the present disclosure.
Figure 4B:
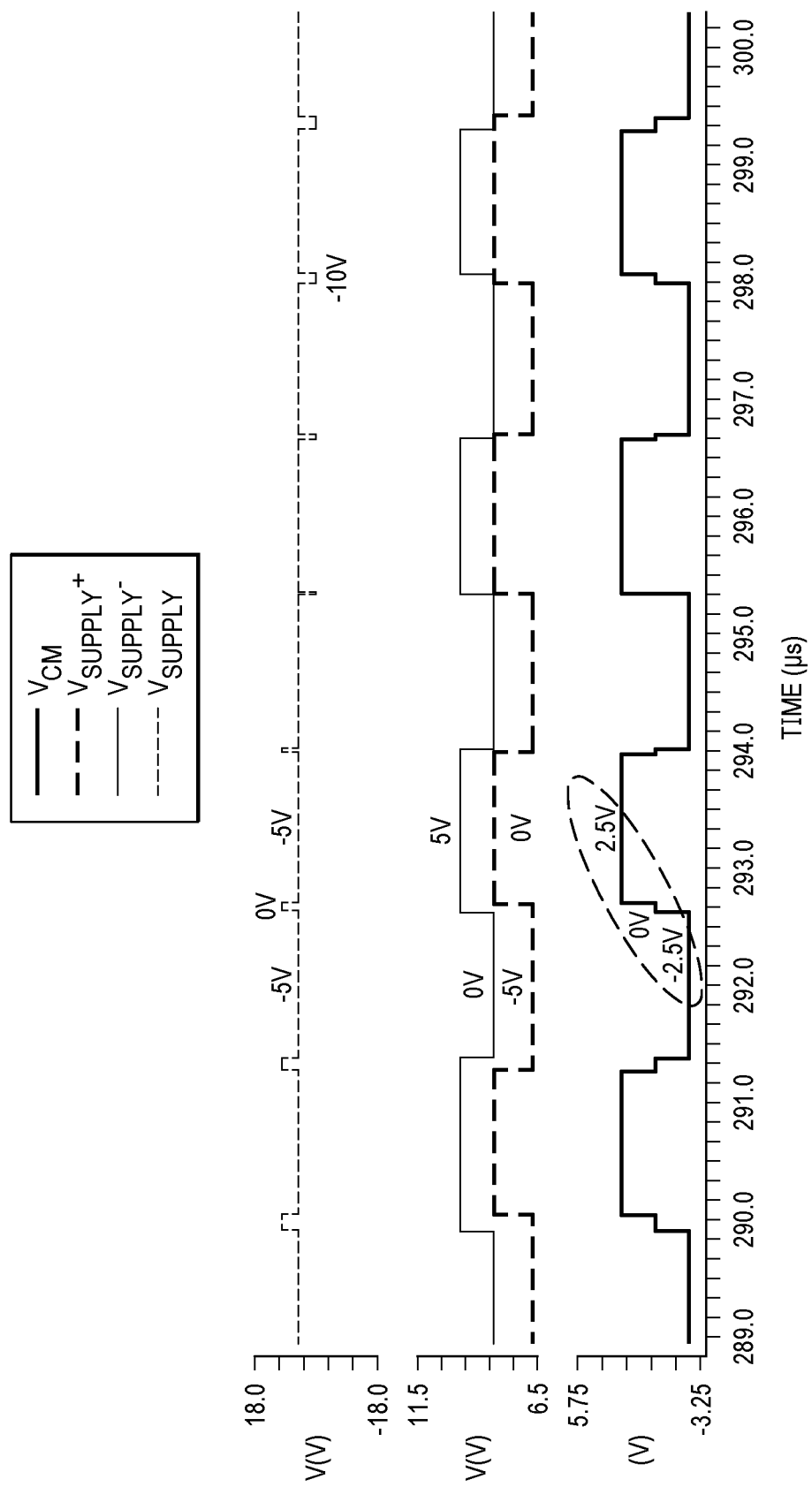
Figure 4C:
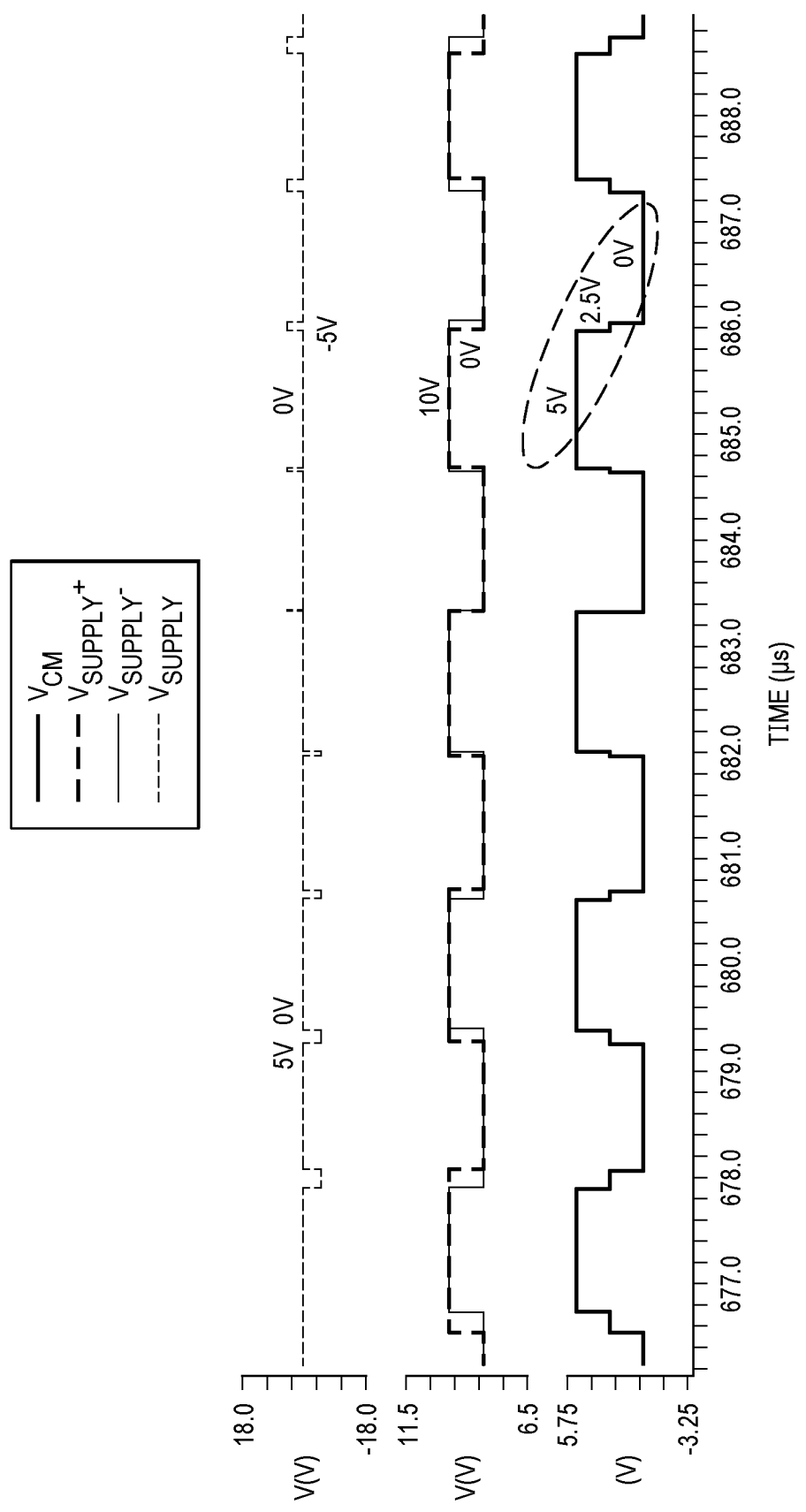
Figure 4D:
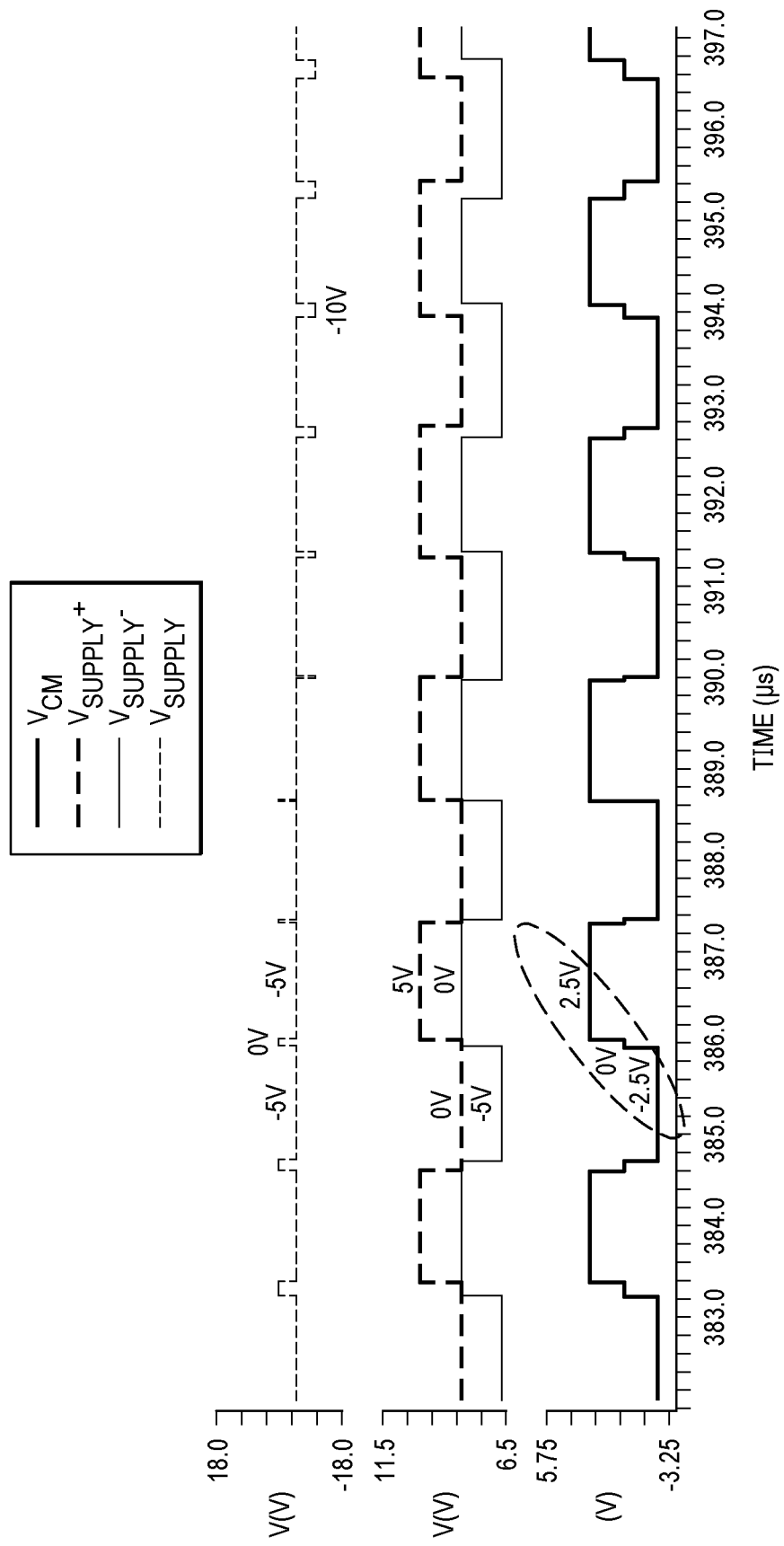
Figure 4E:
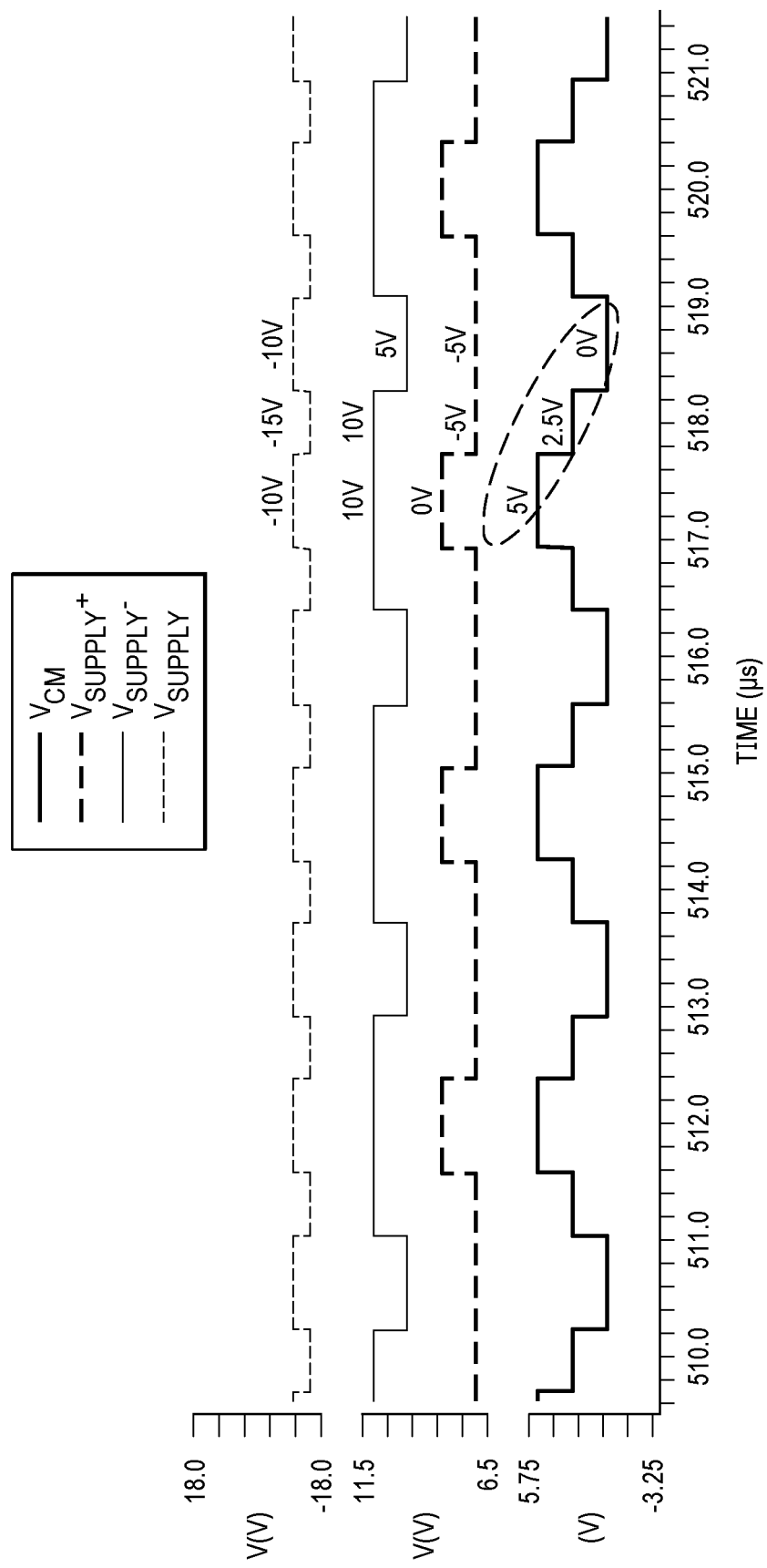

As shown in FIGS. 4A-4E, amplifier 16 may operate in a plurality of regions based on the desired full-swing differential supply voltage $V_{SUPPLY}$. For example, in a Region A of operation, as depicted in FIG. 4A, full-swing differential supply voltage $V_{SUPPLY}$ may be varied between 10V and 15V, which results in a common-mode voltage $V_{CM}$ of output signal $V_{OUT}$ (e.g., $V_{CM}=(V_{SUPPLY}^++V_{SUPPLY}^-)/2$) varying among 0V, 2.5V, and 5V. As another example, in a Region B of operation, as depicted in FIG. 4B, full-swing differential supply voltage $V_{SUPPLY}$ may be varied among $-10V$, $-5V$ and 0V, which results in common-mode voltage $V_{CM}$ varying among $-2.5V$, 0V, and 2.5V. As an additional example, in a Region C of operation, as depicted in FIG. 4C, full-swing differential supply voltage $V_{SUPPLY}$ may be varied among $-5V$, 0V and 5V, which results in common-mode voltage $V_{CM}$ varying among 0V, 2.5V, and 5V. As a further example, in a Region D of operation, as depicted in FIG. 4D, full-swing differential supply voltage $V_{SUPPLY}$ may be varied among $-10V$, $-5V$ and 0V, which results in common-mode voltage $V_{CM}$ varying among $-2.5V$, 0V, and 2.5V. As yet another example, in a Region E of operation, as depicted in FIG. 4E, full-swing differential supply voltage $V_{SUPPLY}$ may be varied between 10V and 15V, which results in common-mode voltage $V_{CM}$ varying among 0V, 2.5V, and 5V.

Notably, Regions B and D, which may occur near a zero-crossing of output signal $V_{OUT}$, have a common-mode voltage $V_{CM}$ which may be different (e.g., lower) than that occurring within Regions A, C, and E. Such drift in common-mode voltage may be replicated to an input of current-sensing circuit 19, thus affecting the measurement of output current $I_{OUT}$, unless measures are taken to account for such change in common-mode voltage $V_{CM}$.

Figure 5:
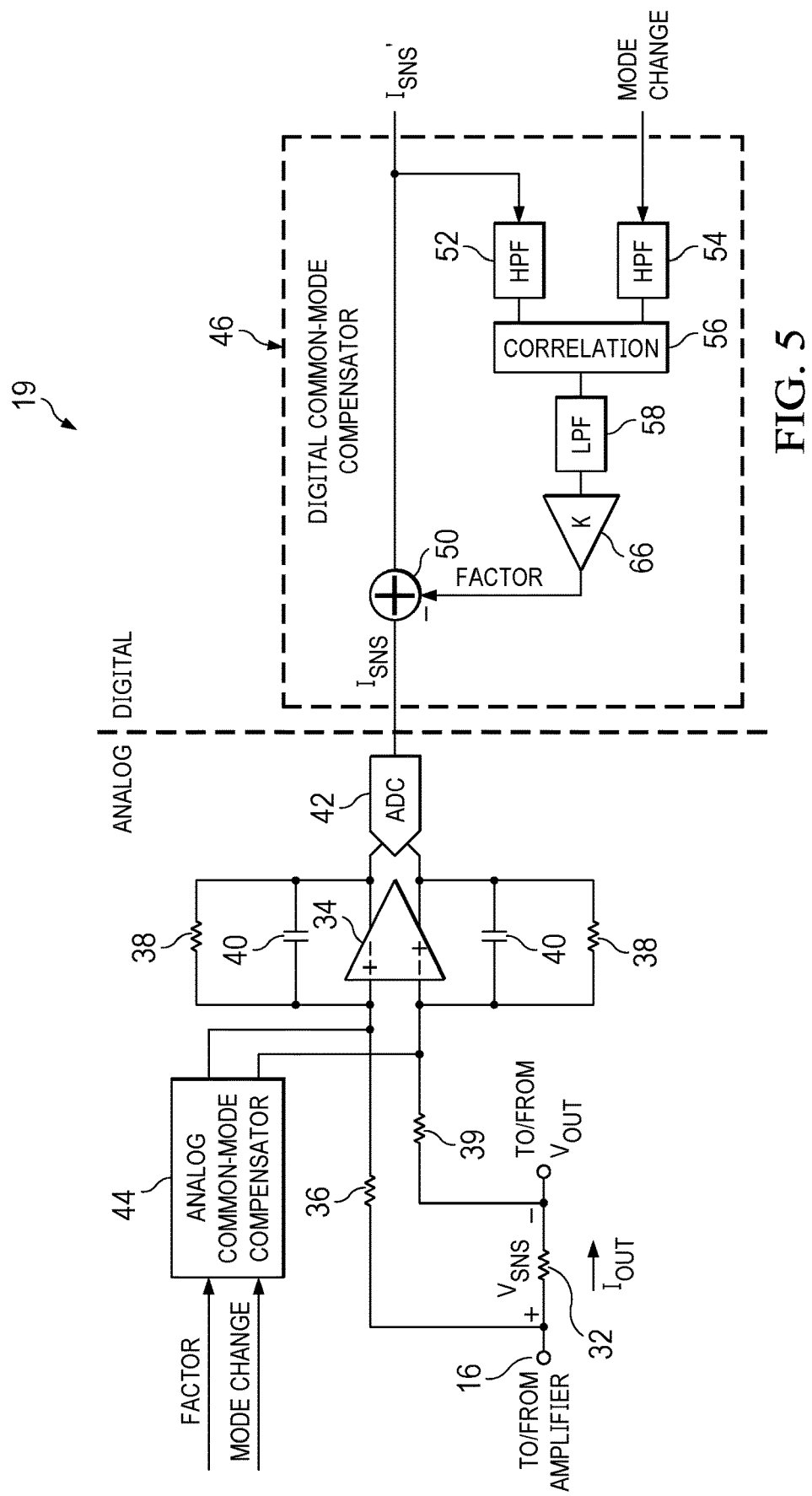
FIG. 5 illustrates a circuit diagram of selected components of an example current-sensing circuit, in accordance with embodiments of the present disclosure.

FIG. 5 illustrates a circuit diagram of selected components of an example current-sensing circuit 19, in accordance with embodiments of the present disclosure. As shown in FIG. 5, current-sensing circuit 19 may be implemented using a sense resistor 32 having a resistance $R_{SNS}$ such that output current $I_{OUT}$ flowing through sense resistor 32 causes a sense voltage $V_{SNS}$ proportional to output current $I_{OUT}$ to form across the terminals of sense resistor 32 (e.g., $V_{SNS}=I_{OUT}R_{SNS}$). An amplifier stage comprising an amplifier 34, input resistors 36, feedback resistors 38, and feedback capacitors 40 may amplify sense voltage $V_{SNS}$ to generate an analog amplified signal proportional to output current $I_{OUT}$. In turn, an analog-to-digital converter (ADC) 42 may generate a digital output signal $I_{SNS}$ equivalent to the analog amplified signal generated by amplifier 34, such that digital output signal $I_{SNS}$ is indicative of output current $I_{OUT}$.

As also shown in FIG. 5, changes in common-mode voltage $V_{CM}$ that affect output signal $V_{OUT}$ and measurement of sense voltage $V_{SNS}$ may be corrected with analog common-mode compensator 44 and/or digital common-mode compensator 46.

Analog common-mode compensator 44 may comprise any system, device, or apparatus configured to, in response to a mode change signal MODE CHANGE and a correction factor FACTOR, generate a correction signal applied at the summing nodes of amplifier 34 in order to compensate for changes in common-mode voltage $V_{CM}$ that affect output signal $V_{OUT}$ and measurement of sense voltage $V_{SNS}$. For example, when mode change signal MODE CHANGE is non-zero, analog common-mode compensator 44 may be configured to apply a correction signal to the summing nodes of amplifier 34 in an amount indicated by correction factor FACTOR. On the other hand, when mode change signal MODE CHANGE is zero, analog common-mode compensator 44 may apply no correction to the summing nodes of amplifier 34.

Mode change signal MODE CHANGE may indicate timing in which a change of common-mode voltage $V_{CM}$ occurs, and may be scaled to indicate an amount of change of common-mode voltage $V_{CM}$ using analog and/or digital scaling factors. In these and other embodiments, mode change signal MODE CHANGE may be generated by microcontroller core 18 based on the value of digital audio input signal DIG_IN. For example, in the specific example described with respect to FIGS. 4A-4E, microcontroller core 18 may cause mode change signal MODE CHANGE to have a non-zero value (e.g., 2.5V) when DIG_IN is below a threshold magnitude, which may indicate operation in Region B or D, operational regions in which common-mode voltage $V_{CM}$ may be stepped down with respect to Regions A, C, and E.

Correction factor FACTOR may comprise an estimate of a value needed to correct for changes in common-mode voltage $V_{CM}$. For example, in some embodiments, the differences in common-mode voltage $V_{CM}$ between operational regions of amplifier 16 may be known (e.g., 2.5V in the example of FIGS. 4A-4E). In other embodiments, correction factor FACTOR may be generated by digital common-mode compensator 46, as described below.

Digital common-mode compensator 46 may comprise any system, device, or apparatus configured to, in response to mode change signal MODE CHANGE and digital output signal $I_{SNS}$, generate correction factor FACTOR and apply correction factor FACTOR to digital output signal $I_{SNS}$ in order to generate corrected digital output signal $I_{SNS}'$. As shown in FIG. 5, digital common-mode compensator 46 may include a summer 50, a high-pass filter (HPF) 52, an HPF 54, a correlation block 56, a low-pass filter (LPF) 58, and a gain element 60.

Summer 50 may combine a difference between digital output signal $I_{SNS}$ with correction factor FACTOR to generate corrected digital output signal $I_{SNS}'$. Because the desired common-mode compensation may only be for content outside the audio spectrum, HPF 52 may filter out audio-frequency components of corrected digital output signal $I_{SNS}'$. Likewise, HPF 54 may perform high-pass filtering of mode change signal MODE CHANGE so that the resulting output signals of HPF 52 and HPF 54 may be correlated by correlation block 56. Correlation between resulting output signals of HPF 52 and HPF 54 may indicate whether or not large changes in corrected digital output signal $I_{SNS}'$ result from a change in operating region of amplifier 16 that causes a change in common-mode voltage VCM. In other words, when changes in corrected digital output signal $I_{SNS}'$ are not correlated with mode change signal MODE CHANGE, such changes in corrected digital output signal $I_{SNS}'$ may occur in response to actual changes in output current $I_{OUT}$, and not due to changes in common-mode voltage VCM.

The output of correlation block 56 may be low-pass filtered by LPF 58 in order to smooth out the correlation signal generated by correlation block 56 (e.g., to remove noise). Gain element 60 may apply a gain K to the signal generated by LPF 58, resulting in correction factor FACTOR to be applied to digital output signal $I_{SNS}$ by summer 50 and/or applied to the summing nodes of amplifier 34 by analog common-mode compensator 44.

Although the foregoing systems and methods have been described with respect to applications involving audio signals, it is understood that the same systems and methods or similar systems and methods may be applied to other signal processing systems that employ multi-level pulse-width modulation systems.

Although the foregoing systems and methods have been described with respect to applications involving sensing of an output current $I_{OUT}$, it is understood that the same systems and methods or similar systems and methods may be applied to sensing and measurement of other electrical quantities in a multi-level pulse-width modulation system, including without limitation an output voltage (e.g., output signal $V_{OUT}$).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system for sensing an electrical quantity comprising:
a sensing stage configured to sense the electrical quantity and generate a sense signal indicative of the electrical quantity, wherein the electrical quantity is indicative of an electrical signal generated by a Class-DG amplifier configured to drive a load wherein the Class-DG amplifier has multiple signal-level common modes; and
a common-mode compensator configured to compensate for changes to a common-mode voltage of a differential supply voltage of the Class-DG amplifier occurring when switching between signal-level common modes of the Class-DG amplifier.

2. The system of claim 1, wherein the electrical quantity comprises an electrical current.

3. The system of claim 1, wherein the electrical quantity comprises an electrical voltage.

4. The system of claim 1, wherein the sensing stage comprises a sense resistor configured to generate a sense voltage indicative of the electrical quantity.

5. The system of claim 4, wherein the sensing stage comprises a sensing stage amplifier configured to amplify the sense voltage.

6. The system of claim 5, wherein the sensing stage comprises an analog-to-digital converter configured to convert the sense voltage, as amplified by the sensing stage amplifier, to an equivalent digital signal indicative of the electrical quantity.

7. The system of claim 6, wherein the common-mode compensator comprises a digital compensator configured to apply a correction factor to the equivalent digital signal.

8. The system of claim 7, wherein the digital compensator is further configured to apply the correction factor to the equivalent digital signal based on a correlation between changes to the equivalent digital signal and changes between operational regions of the differential supply voltage that cause changes to the common-mode voltage of the differential supply voltage.

9. The system of claim 8, further comprising a second common-mode compensator configured to apply the correction factor to input summing modes of the sensing stage amplifier.

10. The system of claim 5, wherein the common-mode compensator comprises an analog compensator configured to apply a correction factor to input summing modes of the sensing stage amplifier.

11. The system of claim 1, wherein the common-mode compensator is configured to enable compensation in response to a change in an operational region of the differential supply voltage that causes changes to the common-mode voltage.

12. A method for sensing an electrical quantity comprising:
generating a sense signal indicative of the electrical quantity, wherein the electrical quantity is indicative of an electrical signal generated by a Class-DG amplifier configured to drive a load wherein the Class-DG amplifier has multiple signal-level common modes; and
compensating for changes to a common-mode voltage of a differential supply voltage of the Class-DG amplifier occurring when switching between signal-level common modes of the Class-DG amplifier.

13. The method of claim 12, wherein the electrical quantity comprises an electrical current.

14. The method of claim 12, wherein the electrical quantity comprises an electrical voltage.

15. The method of claim 12, wherein the sense signal is a sense voltage across a sense resistor, wherein the sense voltage is indicative of the electrical quantity.

16. The method of claim 15, wherein generating the sense signal comprises amplifying the sense voltage with a sensing stage amplifier.

17. The method of claim 16, wherein the sensing stage comprises an analog-to-digital converter configured to convert the sense voltage, as amplified by the sensing stage amplifier, to an equivalent digital signal indicative of the electrical quantity.

18. The method of claim 17, further comprising applying a correction factor to the equivalent digital signal with a digital compensator.

19. The method of claim 18, wherein the digital compensator is further configured to apply the correction factor to the equivalent digital signal based on a correlation between changes to the equivalent digital signal and changes between operational regions of the differential supply voltage that cause changes to the common-mode voltage of the differential supply voltage.

20. The method of claim 19, further comprising a second common-mode compensator configured to apply the correction factor to input summing modes of the sensing stage amplifier.

21. The method of claim 16, further comprising applying a correction factor to input summing modes of the sensing stage amplifier with an analog compensator.

22. The method of claim 12, further comprising enabling compensation in response to a change in an operational region of the differential supply voltage that causes changes to the common-mode voltage.

* * * * *